United States Patent
Ogawa

(10) Patent No.: US 8,536,642 B2
(45) Date of Patent: Sep. 17, 2013

(54) SEMICONDUCTOR DEVICE AND METHOD FOR MANUFACTURING THE SAME

(75) Inventor: Kazuo Ogawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 329 days.

(21) Appl. No.: 12/902,656

(22) Filed: Oct. 12, 2010

(65) Prior Publication Data

US 2011/0121374 A1  May 26, 2011

(30) Foreign Application Priority Data

Nov. 24, 2009 (JP) .................................. 2009-266271

(51) Int. Cl.
*H01L 21/02* (2006.01)

(52) U.S. Cl.
USPC ............ 257/329; 257/E27.056; 257/E27.096; 257/E29.183; 257/E29.313; 257/E29.316

(58) Field of Classification Search
USPC ................... 257/329, E21.41, 27.056–57, 96, 257/29.183–189, 262, 313–318
See application file for complete search history.

(56) References Cited

U.S. PATENT DOCUMENTS

| | | | |
|---|---|---|---|
| 7,670,911 B2 * | 3/2010 | Oyu | 438/271 |
| 2004/0262681 A1 | 12/2004 | Masuoka et al. | |
| 2008/0258209 A1 | 10/2008 | Oyu | |
| 2008/0296677 A1 | 12/2008 | Takaishi | |
| 2009/0042347 A1 * | 2/2009 | Oyu | 438/268 |
| 2009/0085088 A1 | 4/2009 | Takaishi | |
| 2012/0012923 A1 * | 1/2012 | Ryu | 257/329 |

FOREIGN PATENT DOCUMENTS

| | | | |
|---|---|---|---|
| JP | 05-136374 A | 6/1993 | |
| JP | 09-008295 A | 1/1997 | |
| JP | 11-145309 A | 5/1999 | |
| JP | 2004-158585 A | 6/2004 | |
| JP | 2008-053388 A | 3/2008 | |
| JP | 2008-140996 A | 6/2008 | |
| JP | 2008-300623 A | 12/2008 | |
| JP | 2009-043990 A | 2/2009 | |
| JP | 2009-088134 A | 4/2009 | |

* cited by examiner

Primary Examiner — Michael Lebentritt
(74) Attorney, Agent, or Firm — Sughrue Mion, PLLC

(57) ABSTRACT

A vertical transistor comprises a semiconductor region, a pillar region formed on the semiconductor region, a gate insulating film formed so as to cover a side surface of the pillar region, a gate electrode formed on the gate insulating film, a first impurity diffusion region formed in an upper portion of the pillar region, and a second impurity diffusion region formed in the semiconductor region so as to surround the pillar region. The first impurity diffusion region is formed so as to be spaced from the side surface of the pillar region.

14 Claims, 21 Drawing Sheets

FIG.1
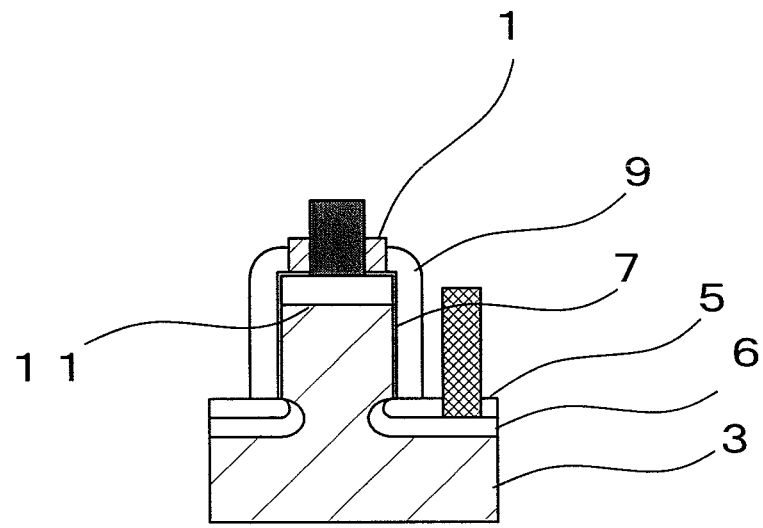
FIG.1A
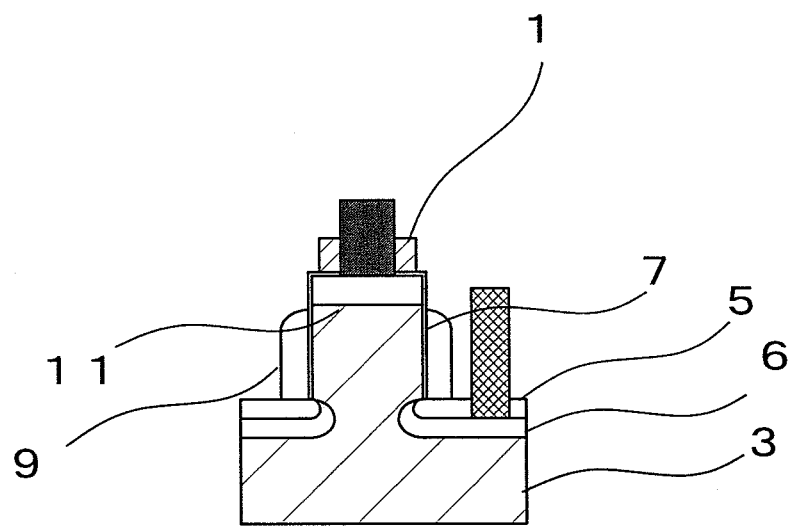
FIG.1B

SEMICONDUCTOR DEVICE AND METHOD FOR MANUFACTURING THE SAME

This application is based upon and claims the benefit of priority from Japanese Patent Application No. 2009-266271, filed on Nov. 24, 2009, the disclosure of which is incorporated herein in its entirety by reference.

BACKGROUND OF THE INVENTION

1. Field of the Invention

The present invention relates to a semiconductor device and a method for manufacturing the same.

2. Description of the Related Art

In a prior art, a vertical transistor has been proposed, as disclosed in US2004-262681 A1. The vertical transistor is a kind of transistor where source and drain regions are formed at upper and lower regions of a pillar region which protrudes upwards from a semiconductor substrate. When turning on the vertical transistor, a channel region is formed in a direction perpendicular to a main surface of the semiconductor substrate.

Meanwhile, it recently requires that consumption current, in particular, standby current of the semiconductor device should reduce. Most of such standby current result from GIDL (Gate Induced Drain Leakage) of the transistor included in the semiconductor device. In the following, how GIDL occurs will be explained referring to, for example, N type channel transistor. When the transistor remains idle, a gate electrical potential is kept with a lower level than a drain electrical potential. At this time, an overlapping portion between a gate electrode and a drain region comes into a deep depression state and, thus, electron-hole pairs are generated. The electrons within the pairs drift into the drain region to generate GIDL. Meantime, the holes within the pairs diffuse into the substrate to generate a substrate electrical current.

In the vertical transistor, the channel region is formed in a direction perpendicular to a main surface of the semiconductor substrate. Moreover, there exists the overlapping portion. These characteristics of the vertical transistor are the same as those of a conventional planar transistor. For this reason, in the vertical transistor, GIDL also occurs in the same manner as explained above.

In order to suppress GIDL from occurring, a structure in which the overlapping portion is diminished or eliminated has been employed. For example, FIG. 1A shows the structure in which the overlapping portion is diminished. Further, FIG. 1B shows the structure in which the overlapping portion is eliminated. Those structures are disclosed in JP2004-158585.

SUMMARY OF THE INVENTION

In one embodiment, there is provided a semiconductor device, comprising a transistor,
wherein the transistor comprises:
a semiconductor region;
a pillar region formed on the semiconductor region;
a gate electrode formed over a side surface of the pillar region with a gate insulating film interposed between the gate electrode and the side surface of the pillar region; and
a first impurity diffusion region,
wherein the first impurity diffusion region is formed in an upper portion of the pillar region so as to be spaced from the side surface of the pillar region.

In another embodiment, there is provided a semiconductor device, comprising a transistor,
wherein the transistor comprises:
a semiconductor substrate comprising a semiconductor region and a pillar region formed on the semiconductor region;
a gate insulating film formed so as to cover a side surface of the pillar region;
a gate electrode formed on the gate insulating film;
a first impurity diffusion region formed in an upper portion of the pillar region so as to be spaced from the side surface of the pillar region; and
a second impurity diffusion region formed in the semiconductor region so as to surround the pillar region.

In another embodiment, there is provided a method for manufacturing a semiconductor device, comprising:
forming a pillar region on a semiconductor region;
forming a second impurity diffusion region in the semiconductor region so as to surround the pillar region;
forming a gate insulating film on a side surface of the pillar region;
forming a gate electrode on the gate insulating film; and
forming a first impurity diffusion region in an upper portion of the pillar region so as to be spaced from the side surface of the pillar region.

In addition, while not specifically claimed in the claim section, the applications reserve the right to include in the claim section at any appropriate time the following semiconductor device:

(1) A semiconductor device, comprising a transistor,
wherein the transistor comprises:
a semiconductor region;
a pillar region formed on the semiconductor region;
a gate electrode formed over a side surface and a top surface of the pillar region with a gate insulating film interposed therebetween;
a first impurity diffusion region;
a second impurity diffusion region;
an electrical conduction layer formed on the top surface of the pillar region so as to be connected to the first impurity diffusion region; and
a sidewall insulating film formed on the top surface of the pillar region so as to insulate the gate electrode from the electrical conduction layer,
wherein the first impurity diffusion region is formed in an upper portion of the pillar region so as to be spaced from the side surface of the pillar region.

(2) A semiconductor device, comprising a transistor,
wherein the transistor comprises:
a semiconductor substrate comprising a semiconductor region and a pillar region formed on the semiconductor region;
a gate insulating film formed so as to cover a side surface of the pillar region;
a gate electrode formed in contact with the gate insulating film so that the gate electrode extends from region over the side surface of the pillar region to region on a top surface of the pillar region;
a first impurity diffusion region formed in an upper portion of the pillar region so as to be spaced from the side surface of the pillar region;
a second impurity diffusion region formed in the semiconductor region so as to surround the pillar region;
an electrical conduction layer formed on the top surface of the pillar region so as to be connected to the first impurity diffusion region; and
a sidewall insulating film formed on the top surface of the pillar region so as to insulate the gate electrode from the electrical conduction layer.

(3) The semiconductor device of (1) or (2), further comprising a capacitor connected to the electrical conduction layer.

(4) A semiconductor device, comprising a transistor,
wherein the transistor comprises:
a semiconductor region;
a plurality of pillar regions formed in form of a matrix in a first direction and a second direction parallel to a main surface of the semiconductor region on the main surface of the semiconductor region;
gate electrodes formed over side surfaces of the pillar regions with gate insulating films interposed therebetween;
first impurity diffusion regions; and
second impurity diffusion regions,
wherein each of the first impurity diffusion regions are formed in upper portion of each of the pillar regions so as to be spaced from the side surface of each of the pillar regions,
wherein a plurality of lower electrodes are formed which the adjacent second impurity diffusion regions to each other in the first direction are short-circuited each other.

(5) A semiconductor device, comprising a transistor,
wherein the transistor comprises:
a semiconductor region;
a pillar region formed on a main surface of the semiconductor region;
a gate electrode formed over a side surface of the pillar region with a gate insulating film interposed therebetween;
a first impurity diffusion region; and
a second impurity diffusion region,
wherein the first impurity diffusion region is formed in an upper portion of the pillar region so as to be spaced from the side surface of the pillar region, and
the second impurity diffusion region is formed in an outer periphery region of a lower portion of the pillar region, and
a discharging layer connecting a channel region with the semiconductor region is formed in a center region of the lower portion of the pillar region.

(6) The semiconductor device of (4) or (5), further comprising a capacitor connected to the first impurity diffusion region.

(7) A semiconductor device in which a high voltage transistor with a relatively high driving voltage and a low voltage transistor with a relatively low driving voltage are mixed and mounted onto a substrate,
wherein the low voltage transistor comprises:
a semiconductor region;
a pillar region formed on the semiconductor region;
a gate electrode formed over a side surface of the pillar region with a gate insulating film interposed therebetween;
a first impurity diffusion region; and
a second impurity diffusion region, and
the first impurity diffusion region is formed in an upper portion of the pillar region so as to be spaced from the side surface of the pillar region, and is included in a single unit transistor,
wherein the high voltage transistor is a plurality of unit transistors whose semiconductor pillar regions have a height equal to that of the pillar region of the low voltage transistor as the single unit transistor,
first and second impurity diffusions of the plurality of unit transistors are connected in a serial way, and
gate electrodes of the plurality of unit transistors are electrically connected each other.

(8) The semiconductor device of (7), further comprising a capacitor connected to the first impurity diffusion region.

BRIEF DESCRIPTION OF THE DRAWINGS

The above features and advantages of the present invention will be more apparent from the following description of certain preferred exemplary embodiments taken in conjunction with the accompanying drawings, in which:

FIG. 1A and FIG. 1B illustrate views of related semiconductor devices;

Figure 2:
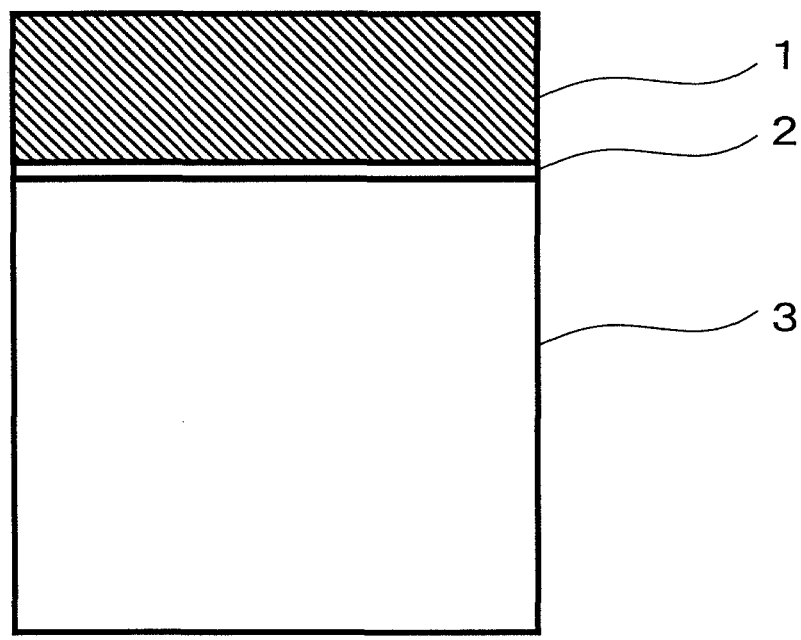
FIG. 2 to FIG. 14 illustrate cross-sectional views of one manufacturing process of a semiconductor device according to a first exemplary embodiment.

In the drawings, reference numerals have the following meanings: 1: silicon nitride film, 2, 5: silicon oxide film, 3: semiconductor region, 3a: pillar region, 4: insulating film, 6: second impurity diffusion region, 7: gate insulating film, 9: gate electrode, 10, 21, 22: interlayer insulating film, 11: first impurity diffusion region, 12, 13, 14, 15: contact plug, 16: capacitor, 17: bit line, 18: side surface of pillar region, 19: top surface of pillar region, 20: channel length direction, 23: direction perpendicular to channel length direction, 32: operation processing device, 33: DRAM device, 34: ROM, 35: system bus, 36: non-volatile memory device, 37: input/output apparatus, A, B, C: contact hole (opening). Tr: transistor

DETAILED DESCRIPTION OF THE REFERRED EMBODIMENTS

Figure 21:
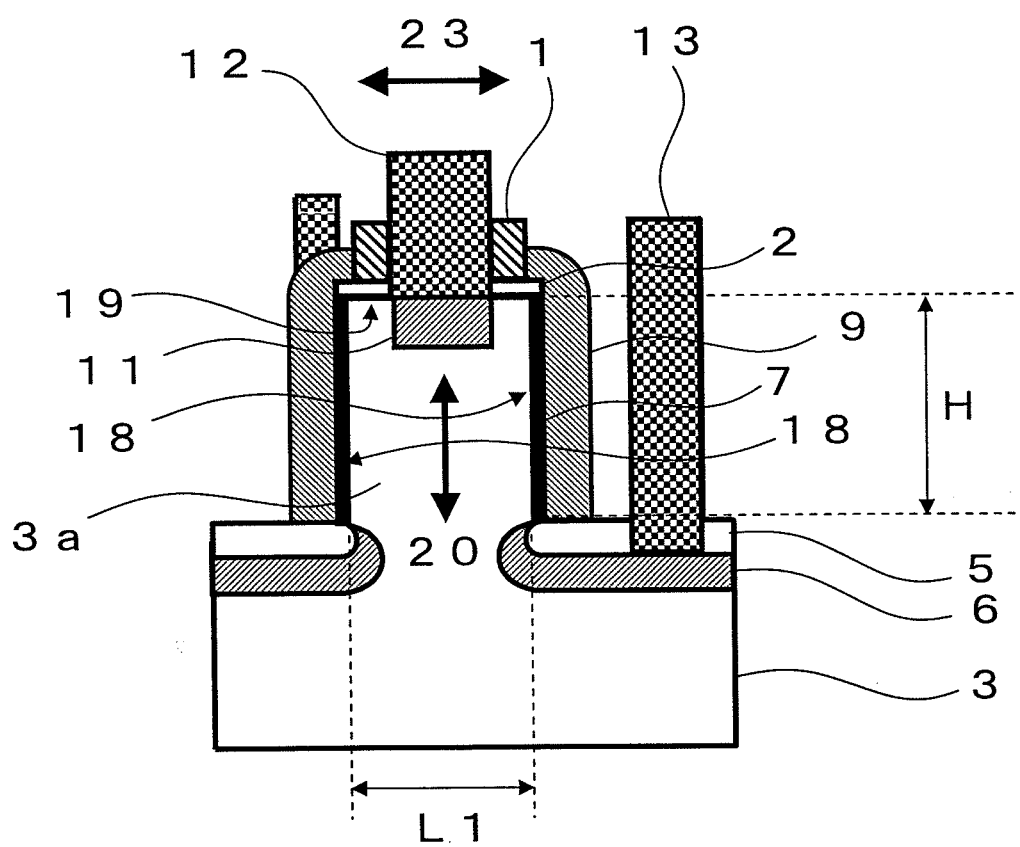
FIG. 21 illustrates a cross-sectional view of one example of a semiconductor device according to the present invention.

FIG. 21 illustrates a cross-sectional view of one example of a semiconductor device according to the present invention. As illustrated in FIG. 21, the semiconductor device includes a vertical transistor. The vertical transistor includes semiconductor region 3, pillar region 3a, gate insulating film 7 on side surface 18 of the pillar region, and gate electrode 9 on the gate insulating film. Gate electrode 9 extends form region over side surface 18 of pillar region 3a to region on top surface 19 of the pillar region.

First impurity diffusion region 11 is formed in an upper region of pillar region 3a. First impurity diffusion region 11 is provided so as to be spaced from side surface 18 of the pillar region. Second impurity diffusion region 6 is formed within semiconductor region 3 so as to surround pillar region 3a.

Contact plug 12 is formed on first impurity diffusion region 11 in the pillar region. On top surface 19 of pillar region 3a, sidewall insulating film 1 is interposed between contact plug 12 and gate electrode 9.

In this way, first impurity diffusion region 11 is provided so as to be spaced from side surface 18 of pillar region 3a. For this reason, first impurity diffusion region 11 is not formed just near side surface 18 of pillar region 3a. By intervening, on top surface 19 of pillar region 3a, sidewall insulating film 1 between contact plug 12 and gate electrode 9, gate electrode 9 does not overlap with first impurity diffusion region 11 in a direction 23 perpendicular to a channel length direction and, further, there exists a predetermined space (offset) between first impurity diffusion region 11 and gate electrode 9.

In such a semiconductor device, an effect that GIDL is prevented from occurring can be attained when first impurity diffusion region 11 is used as a drain region of the transistor. In other words, in such a semiconductor device, the effect that GIDL is prevented from occurring can't be attained when second impurity diffusion region 6 is used as a drain region of the transistor.

In the following, how GIDL is prevented from occurring will be explained referring to, for example, N type channel transistor. In this case, a silicon substrate is P type. When the transistor remains idle, a gate electrical potential is set to a sufficiently low level. At this time, top surface 19 of the pillar region and side surface 18 of the pillar region within silicon substrate 3 come into an electrical charge accumulation state. Therefore, all of lines of electric force generated from gate electrode 9 is terminated at silicon substrate 3 (to be specific, top surface 19 of the pillar region and side surface 18 of the pillar region) and, thus, can't reach first impurity diffusion region 11. That is, when the gate electrical potential is sufficiently low, electrical field due to gate electrode 9 is completely blocked by silicon substrate 3 and, hence, does not have bad influence on first impurity diffusion region 11. As a result, in such a transistor, GIDL is, in principle, prevented from occurring.

Now, function and performance of the transistor will be explained. If a film thickness L1 of the pillar region and other design parameters are appropriately selected, the vertical transistor functions as a full depletion type device. In such a full depletion type device, while turning on the transistor, the entirety of pillar region 3a surrounded by the gate electrode becomes a channel region. For this reason, although the first impurity diffusion region is offset (spaced away) in a direction perpendicular to the channel length direction, function and performance loss in the transistor does not occur and the transistor works very well.

Moreover, whether the transistor becomes a full depletion type device or a partial depletion type device depends on a relation between the film thickness L1 of pillar region 3a (a diameter of the pillar; a thickness of pillar region 3a in a direction 23 perpendicular to the side surface of the pillar region) and a width L2 of a maximum depletion layer. That is to say, if the film thickness L1 of the semiconductor layer is smaller than the width L2 of the maximum depletion layer, the transistor becomes the full depletion type device, whereas if the film thickness L1 of the semiconductor layer is larger than the width L2 of the maximum depletion layer, the transistor becomes the partial depletion type device.

In addition, when the silicon substrate is used, the width L2 of the maximum depletion layer is represented by following equations (A) and (B):

$$L2 = (2\epsilon_{s,i}\epsilon_0 2\phi_F/qN_A)^{1/2} \quad (A)$$

$$\phi_F = (kT/q)\ln(N_A/n_i) \quad (B)$$

($\epsilon_{s,i}$: a relative dielectric constant of silicon, $\epsilon_0$: the dielectric constant of vacuum, q: the elementary electrical charge, $N_A$: an impurity concentration in the silicon substrate, k: the Boltzmann constant, T: temperature, $n_i$: an intrinsic carrier concentration).

According to the above equations, in order that the transistor becomes a full depletion type device, the film thickness L1 of pillar region and the impurity concentration $N_A$ need to be controlled. Here, in case that the impurity concentration $N_A$ is set to a concentration which is generally used, the film thickness L1 (the pillar diameter) of pillar region 3a is controlled in order that the transistor becomes a full depletion type device. Therefore, in order that the transistor becomes a full depletion type device, the pillar diameter is preferably small. The pillar diameter is more preferably equal to or less than two times of a height of pillar region 3a. Moreover, in case that the pillar diameter (a thickness of pillar region 3a in a direction 23 perpendicular to the side surface of the pillar region) is not constant (for example, in case that a planar cross-section of pillar region 3a has a rectangular shape and, thus, long side length and short side length lengths thereof are different each other), the smallest pillar diameter is preferably equal to or less than two times of the height L of pillar region 3a. For example, the pillar diameter is in a range of 30 to 50 nm and the height of the pillar region is in a range of 100 to 150 nm.

Further, structures of the vertical transistor are disclosed in US2008-0258209 A1 (JP2008-140996 A), US2009-0085088 A1 (JP2009-088134 A) and US2008-0296677 A1 (JP2008-300623 A), all of which are incorporated herein by reference.

In the following, preferable exemplary embodiments of the present invention will be described in details with reference to the accompanying drawings.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In addition, the exemplary embodiments below will be explained by dividing them into a plurality of sections or embodiments if necessary for convenience. They should not be construed as not being related to one another, and are in relations of modified embodiments of parts or the entirety thereof, detailed explanation, and supplemental explanations, etc., unless otherwise expressly described herein.

[First Exemplary Embodiment]

First, silicon substrate 3 was prepared and an active region was formed in silicon substrate 3 (in the following figures, only the active region is shown, and within each figure, the active region is not explicitly referenced). Thereafter, pillar region 3a was formed in the active region.

To form pillar region 3a, as a first step, silicon oxide film 2 as a protection insulation film and silicon nitride film 1 as a hard mask were formed over an entire surface of silicon substrate 3 (FIG. 2). Silicon oxide film 2 and silicon nitride film 1 may be formed by many methods, including but not limited to, CVD method. A thickness of silicon oxide film 2 is preferably approximately 5 nm and a thickness of silicon nitride film 1 is preferably approximately 120 nm.

Figure 3:
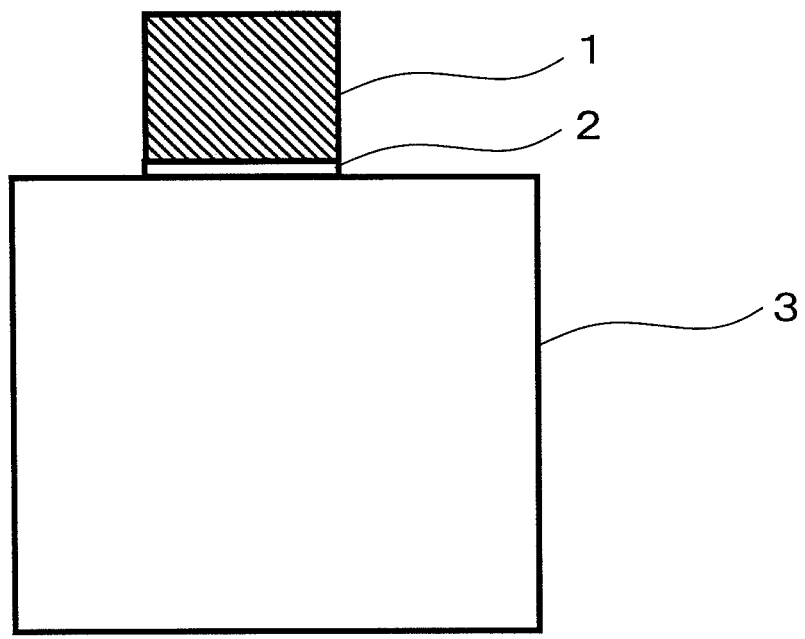

Subsequently, silicon oxide film 2 and silicon nitride film 1 were patterned. By such a patterning, silicon oxide film 2 and silicon nitride film 1 were leaved on a region in which pillar region 3a is to be formed and a region which is more outside than the active region, and silicon oxide film 2 and silicon nitride film 1 were removed at the other region (FIG. 3).

Next, an exposed portion of the active region was etched away by a dry etching method using the patterned silicon oxide film 2 and silicon nitride film 1 as a mask. By this etching process, a recess was formed in the exposed portion of the active region, and pillar region 3a substantially perpendicular to the main face of silicon substrate 3 was formed at the region which was not etched away.

Figure 4:
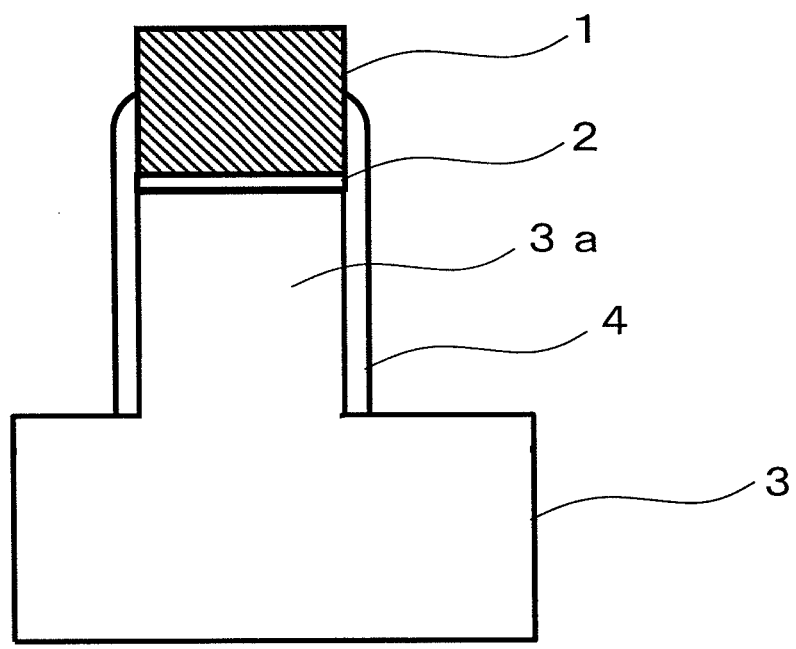

Thereafter, insulation film 4 was formed on a side surface of pillar region 3a (FIG. 4). Insulation film 4 was formed by protecting, while silicon oxide film 2 and silicon nitride film 1 remained, the exposed surface of the active region in a thermal oxidation manner and, next, forming a silicon nitride film and, then, etching back the formed silicon nitride film. As a result, an inner peripheral surface of the active region and the side surface of pillar region 3a were covered with insulation film 4.

Figure 5:
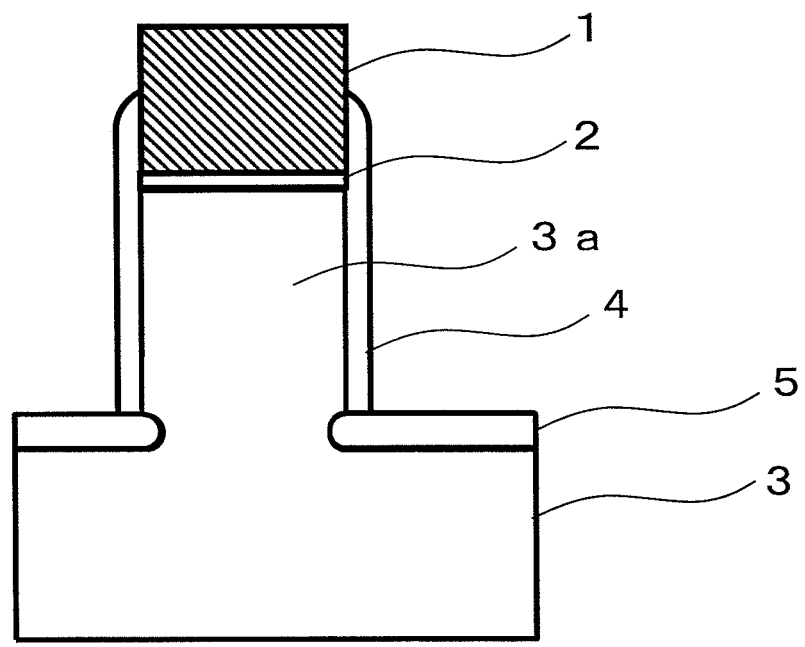

Next, silicon oxide film 5 was formed on an exposed surface of the active region (a bottom surface of the active region) by a thermal oxidation manner (FIG. 5). At this time, since a top surface and the side surface of pillar region 3a were covered with silicon oxide film 2 and silicon nitride film 1, and insulation film 4 respectively and, these films were not thermally oxidized. A thickness of silicon oxide film 5 is preferably approximately 30 nm, but the thickness is not limited thereto.

Figure 6:
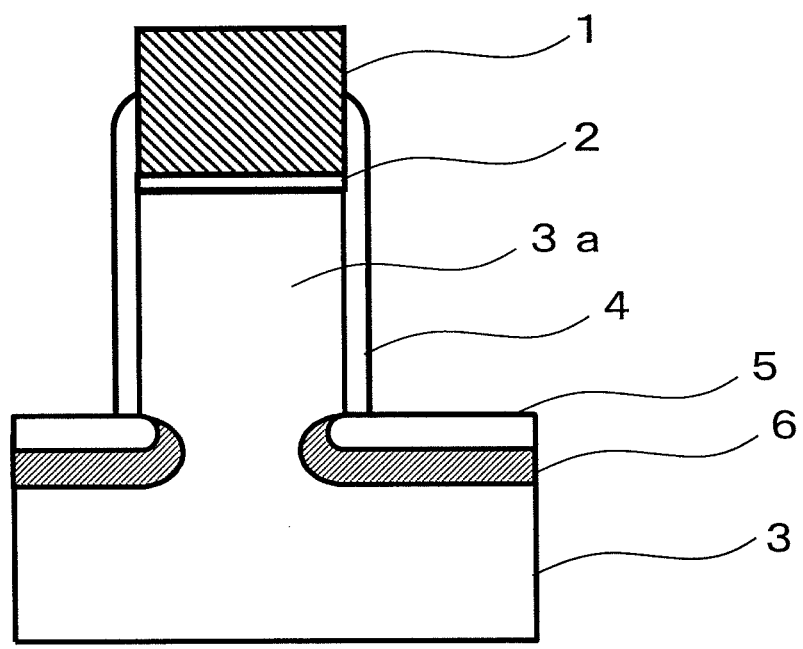

Subsequently, second impurity diffusion region 6 was formed in lower portion of pillar region 3a (FIG. 6). Second impurity diffusion region 6 was formed by implanting impurities having an opposite conductance type to that of impurities within the silicon substrate through silicon oxide film 5 formed on the surface of the active region.

Figure 7:
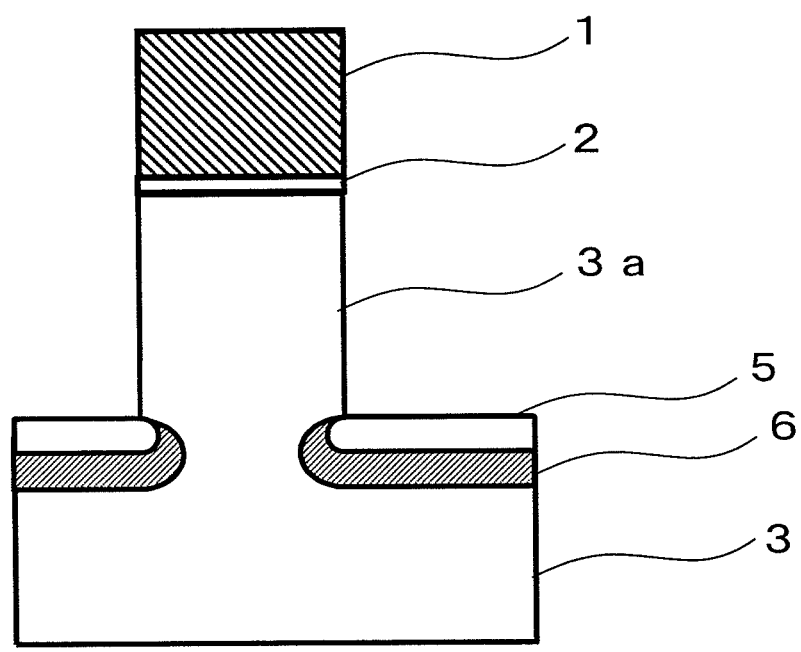

Thereafter, insulation film 4 was removed by a wet etching method (FIG. 7). Consequently, silicon oxide film 5 formed on the bottom face of the active region and the side surface of pillar region 3a were exposed. At this time, the top face of pillar region 3a had still been covered with silicon oxide film 2 and silicon nitride film 1.

Figure 8:
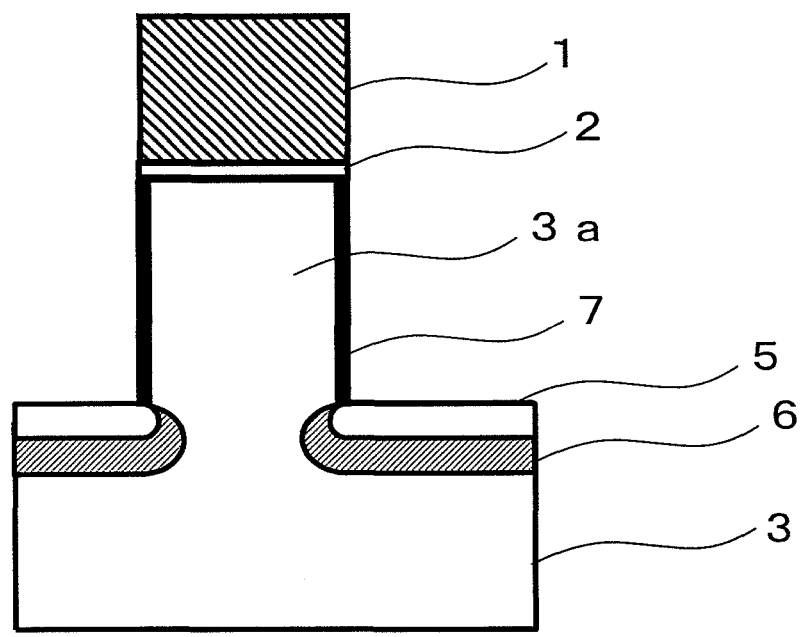

Next, while silicon oxide film 2 and silicon nitride film 1 remained, gate insulating film 7 was formed on the side surface of pillar region 3a (FIG. 8). Gate insulating film 7 may be formed by a thermal oxidation manner and a thickness thereof preferably is approximately 5 nm.

Figure 9:
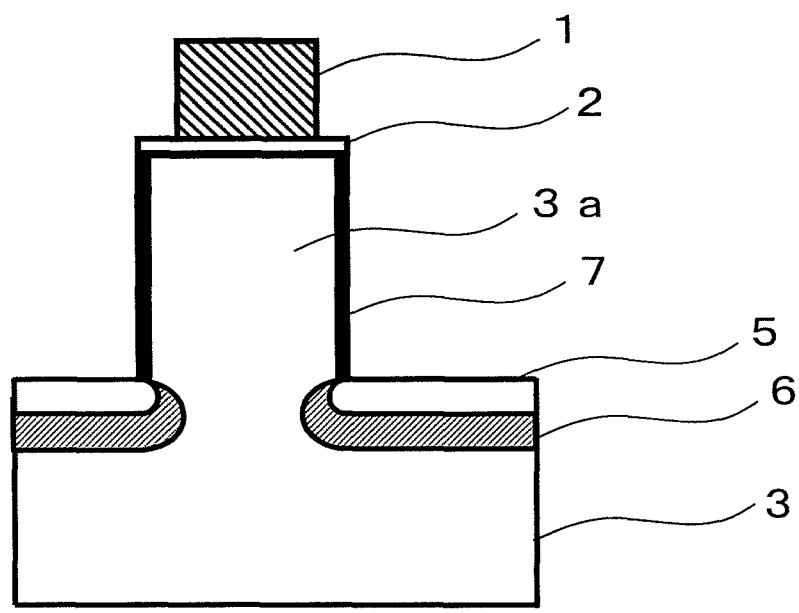

Subsequently, the size of silicon nitride film 1 was diminished by an isotropic etching method (FIG. 9).

Figure 10:
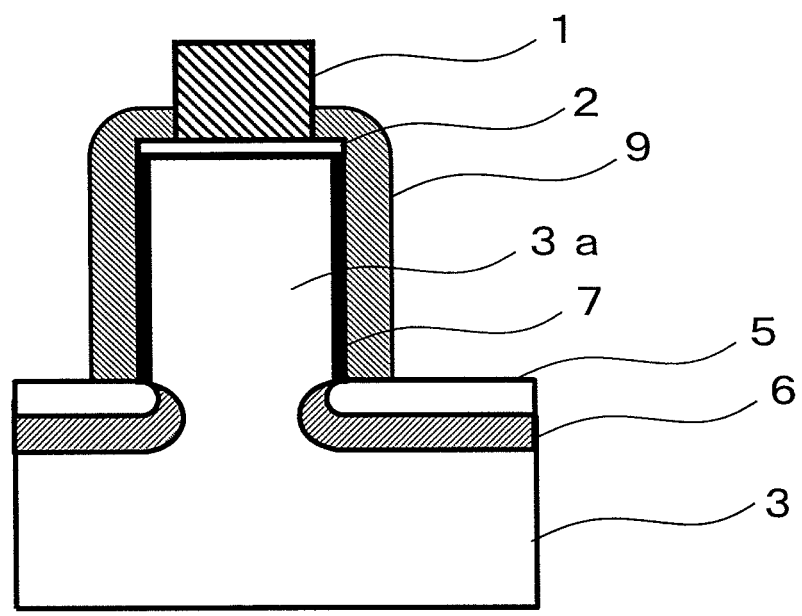

In a following step, gate electrode 9 was formed which was made of a polysilicon film. Gate electrode 9 was formed by forming, while silicon nitride film 1 remained, polysilicon film 9 with a thickness of about 30 nm over the entire surface of the silicon substrate by CVD method, and then etching back the formed polysilicon film (FIG. 10). As a result, gate electrode 9 was formed so that the gate electrode 9 extended from region over the side surface of pillar region 3a to region on the top surface of pillar region 3a.

Meantime, a single-layered film made of a metal film or a multi-layered film made of a polysilicon film and a metal film may be employed as gate electrode 9. The metal film used as the gate electrode may use refractory metals such as tungsten (W), nitride tungsten (WN), tungsten silicide (WSi), etc.

Figure 11:
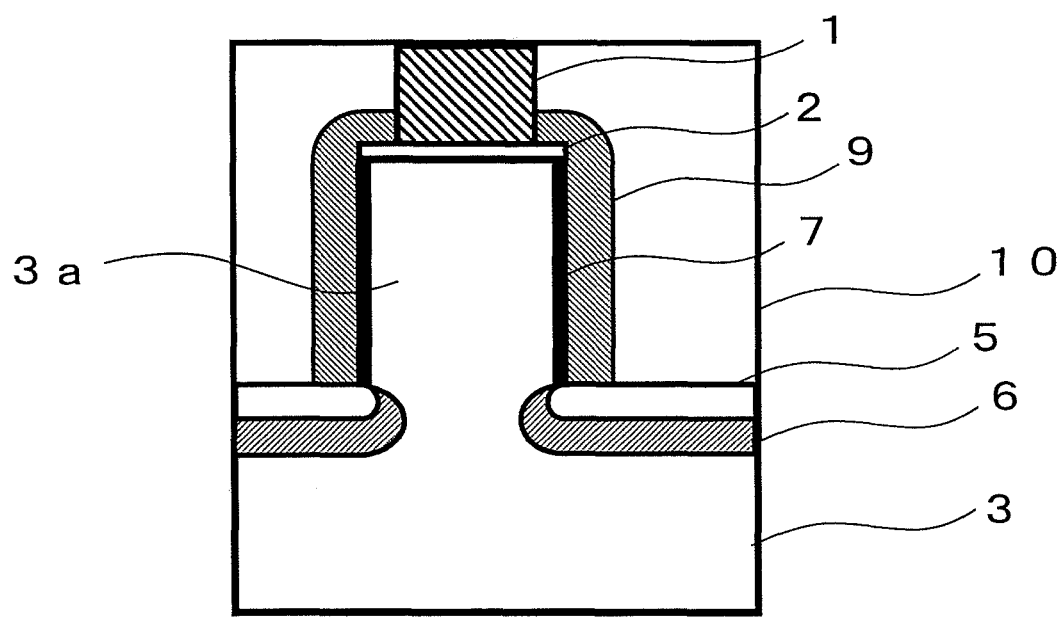

Next, interlayer insulating film 10 made of a silicon oxide film was formed over the entire surface of the silicon substrate and, then, was planarized by polishing a surface thereof using CMP method (FIG. 11). In this time, because silicon nitride film 1 functioned as a CMP stopper, a thickness of interlayer insulating film 10 could be reliably controlled.

Figure 12:
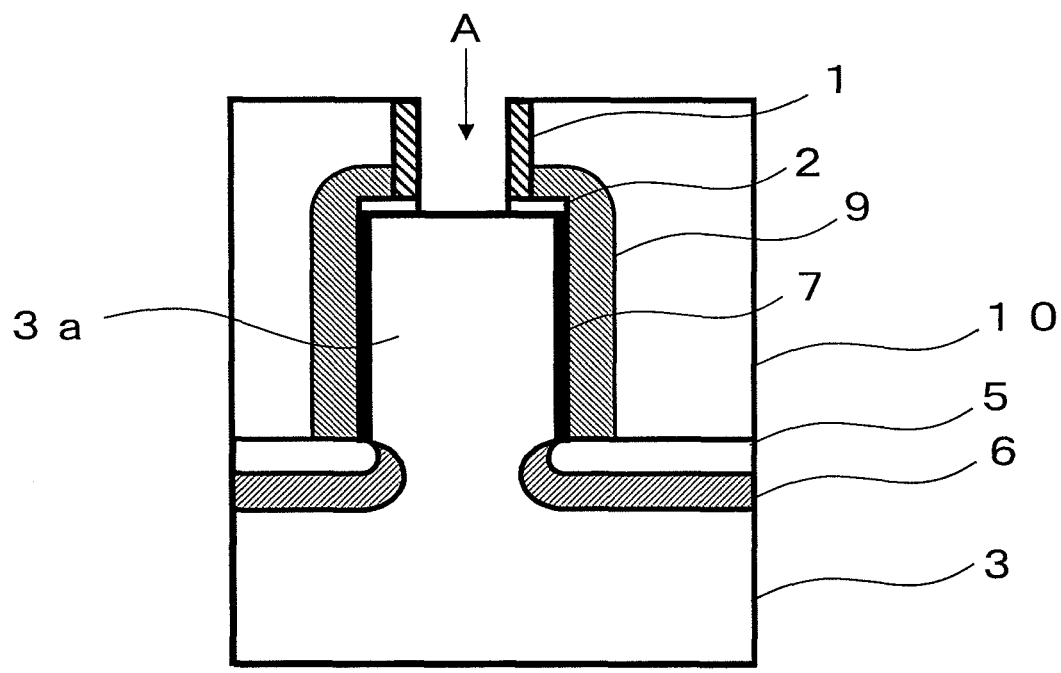

In a subsequent step, portions of silicon oxide film 2 and silicon nitride film 1 formed on the top surface of pillar region 3a were selectively removed to form contact hole (opening) A (FIG. 12). In forming contact hole A, a mask oxide film (not shown), to begin with, was formed over the entire surface of the silicon substrate. This mask oxide film may be formed using CVD method and a thickness of the mask oxide film preferably is about 5 nm. Next, the mask oxide film was patterned so that the portion of silicon nitride film 1 formed over the top surface of pillar region 3a was exposed. Thereafter, the exposed portions of silicon oxide film 2 and silicon nitride film 1 were removed by a wet or dry etching method, to form through-hole A having a bottom surface as the top surface of pillar region 3a.

Figure 13:
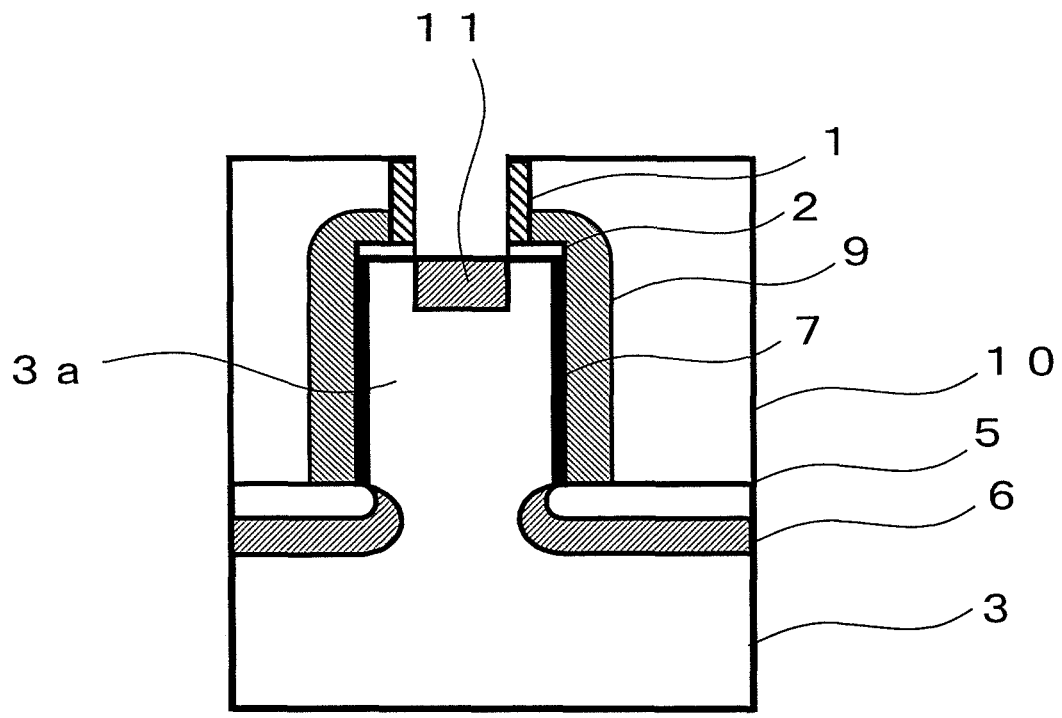

Thereafter, first impurity diffusion region 11 was formed in an upper portion of pillar region 3a (FIG. 13). First impurity diffusion region 11 was formed by implanting a low concentration of impurities having an opposite conductance type to that of impurities within pillar region 3a through silicon nitride film 1 formed over the top surface of pillar region 3a. At this time, an ion implanting condition was set so that first impurity diffusion region 11 was spaced from the side surface of pillar region 3a. Further, an overlapping portion between first impurity diffusion region 11 and gate electrode 9 was not generated by adjusting the ion implanting condition.

Figure 14:
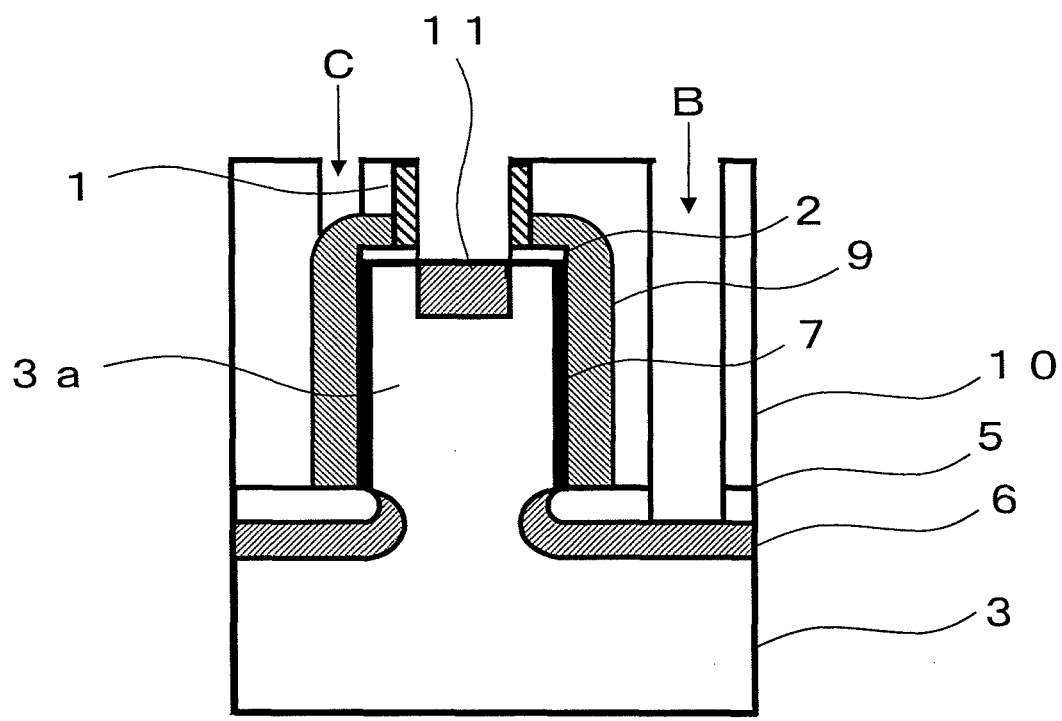

At a following step, contact holes (openings) B, C were formed by a patterning (FIG. 14). Contact holes B, C were formed at region which is located in the active region near pillar region 3a and in which anything else is not installed. Contact holes B, C penetrate into interlayer insulating film 10 and reach second impurity diffusion region 6 and gate electrode 9, respectively.

Next, contact holes A, B and C were filled with polysilicon to form contact plugs 12, 13. Contact plug 12 is connected to first impurity diffusion region 11, and contact plugs 13 are connected to second impurity diffusion region 6 and gate electrode 9 respectively.

Figure 15:
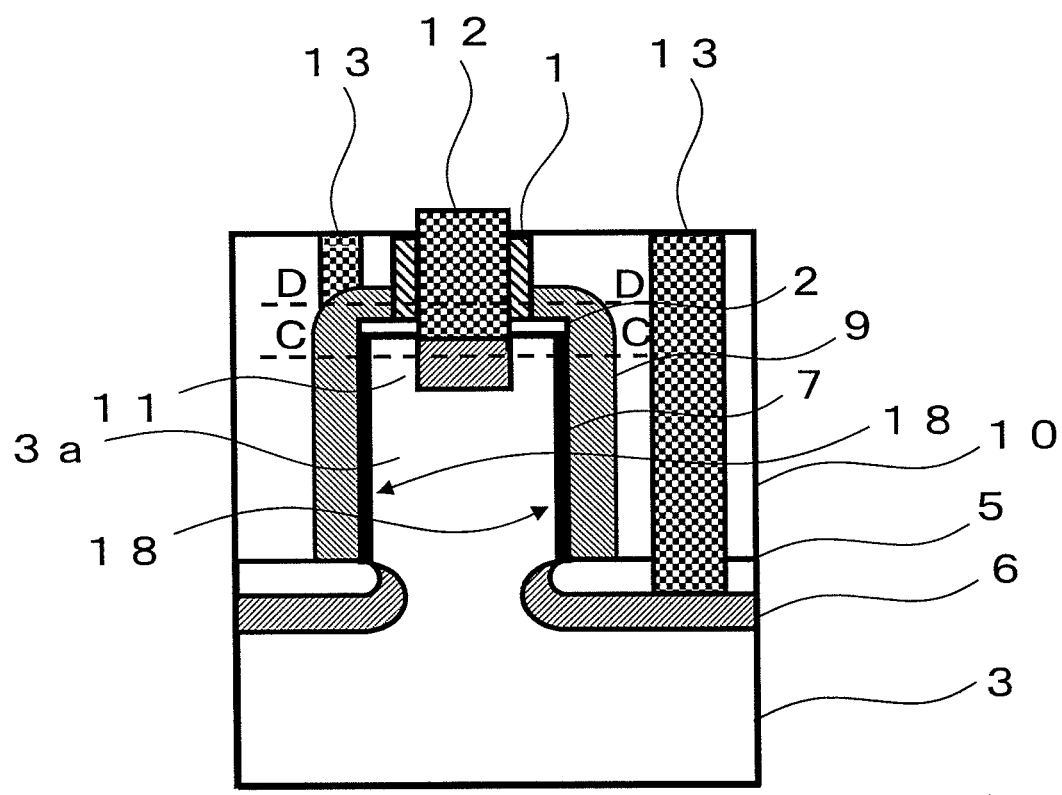
FIG. 15 illustrates a cross-sectional view of the semiconductor device according to the first exemplary embodiment.
Figure 16:
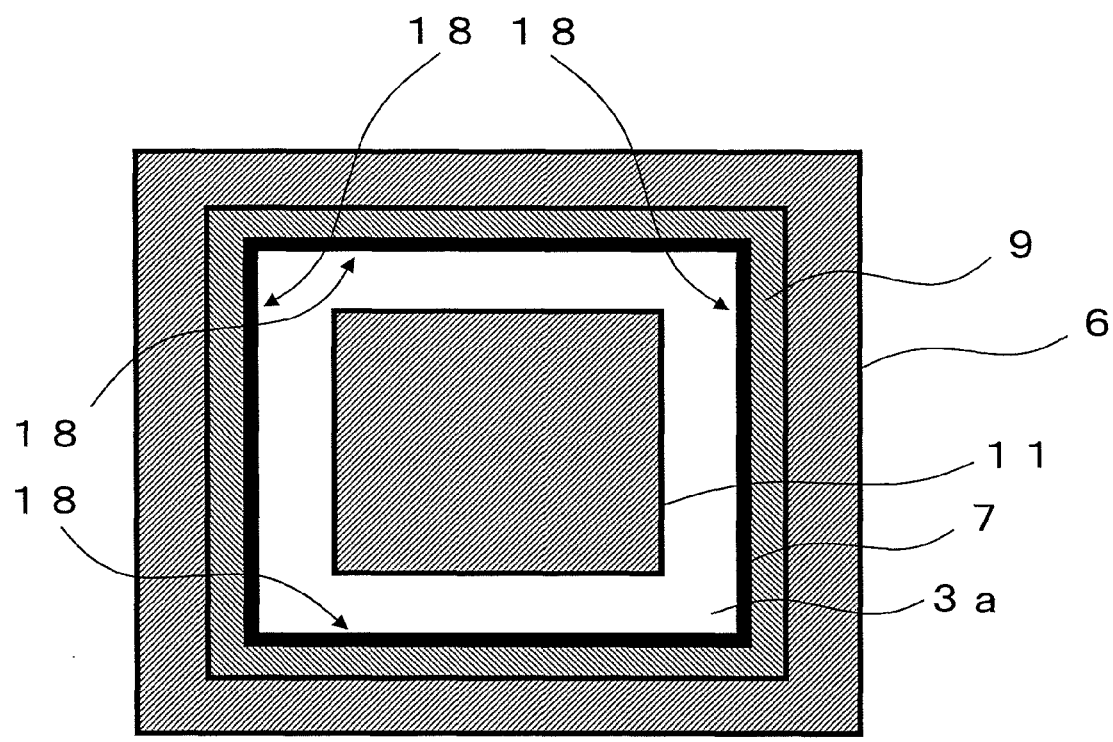
FIG. 16 illustrates a cross-sectional view taken at a line C-C of the semiconductor device in FIG. 15.
Figure 17:
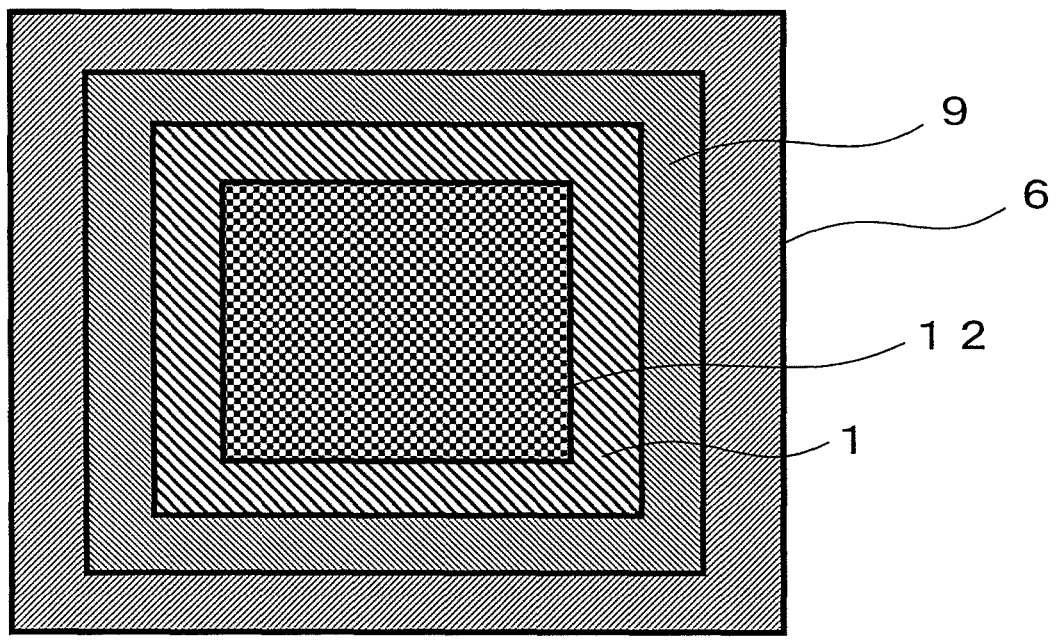
FIG. 17 illustrates a cross-sectional view taken at a line D-D of the semiconductor device in FIG. 15.

A semiconductor device including the vertical transistor according to this exemplary embodiment was manufactured by performing the above-mentioned processes. FIG. 15 shows a cross-sectional view of the resultant semiconductor device. In addition, FIG. 16 shows a cross-sectional view taken at a line C-C of the semiconductor device in FIG. 15; and FIG. 17 shows a cross-sectional view taken at a line D-D of the semiconductor device in FIG. 15. Although second impurity diffusion region 6 does not exist at the cross-sections taken at the lines C-C and D-D in FIG. 15, second impurity diffusion region 6 is shown in FIG. 16 and FIG. 17 in order to make an entire configuration of the semiconductor device understood more easily. As shown in FIG. 16, in the semiconductor device including the vertical transistor according to this exemplary embodiment, first impurity diffusion region 11 is formed so as to be spaced from side surface 18 of pillar region 3a. For this reason, first impurity diffusion region 11 is not formed just near side surface 18 of pillar region 3a. As shown in FIG. 17, by intervening silicon nitride film 1 between contact plug 12 and gate electrode 9 on the top surface of pillar region 3a, gate electrode 9 is spaced from contact plug 12. A position and size of a cross-section of first impurity diffusion region 11 in FIG. 16 are the same as those of a cross-section of contact plug 12 in FIG. 17. Accordingly, gate electrode 9 does not overlap with first impurity diffusion region 11 in a direction perpendicular to a channel length direction and, further, there exists a predetermined space (offset) between first impurity diffusion region 11 and gate electrode 9 in the direction perpendicular to the channel length direction.

In the semiconductor device according to this exemplary embodiment, an effect that GIDL is prevented from occurring can be attained when first impurity diffusion region 11 is used as a drain region of the transistor. How GIDL is prevented from occurring for example in N type channel transistor is as follows. A gate electrical potential, when the transistor remains idle, is set to a sufficiently low level. At this time, top surface 19 of the pillar region and side surface 18 of the pillar region within silicon substrate 3 come into an electrical charge accumulation state. Therefore, all of lines of electric force generated from gate electrode 9 terminates at top surface 19 of the pillar region and side surface 18 of the pillar region and, thus, can't reach first impurity diffusion region 11. As a result, in the transistor according to the present exemplary embodiment, GIDL is, in principle, prevented from occurring.

Figure 18:
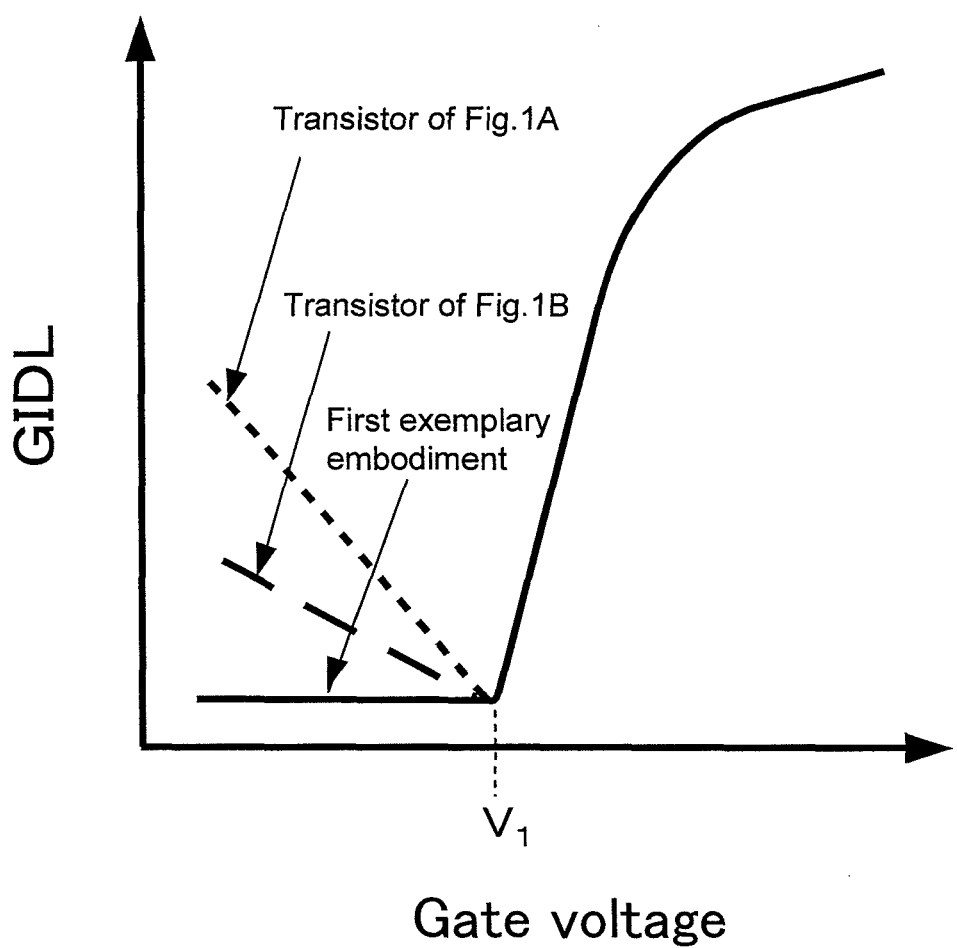
FIG. 18 illustrates a graph illustrating measuring results of GIDL in the semiconductor device according to the first exemplary embodiment and the related semiconductor devices.

FIG. 18 shows a schematic graph illustrating relationships between a gate voltage and GIDL in the transistor (FIG. 15 to FIG. 17) according to the first exemplary embodiment of the present invention and the prior-art transistors (FIG. 1A, FIG. 1B). As shown in FIG. 18, when the gate voltage <$V_1$, GIDL has a constant and low level in the transistor according to the first exemplary embodiment of the present invention, whereas GIDL in the prior-art transistors (FIG. 1A, FIG. 1B) has larger levels than GIDL in the transistor according to the first exemplary embodiment of the present invention. Meanwhile, when the gate voltage $\geq V_1$, GIDL in the prior-art transistors (FIG. 1A, FIG. 1B) has the same level as GIDL in the transistor according to the first exemplary embodiment of the present invention.

In the transistor according to the first exemplary embodiment of the present invention, in that the lateral size (a thickness of pillar region 3a in a direction perpendicular to the side surface of the pillar region; the pillar diameter) is small (50 nm), the transistor becomes the full depletion type device. Consequently, the entirety of pillar region 3a surrounded by the gate electrode becomes a channel region. For this reason, although first impurity diffusion region 11 is offset (spaced away) in the direction perpendicular to the channel length direction, a function and performance loss in the transistor does not occur and the transistor works very well.

[Second Exemplary Embodiment]

Figure 19:
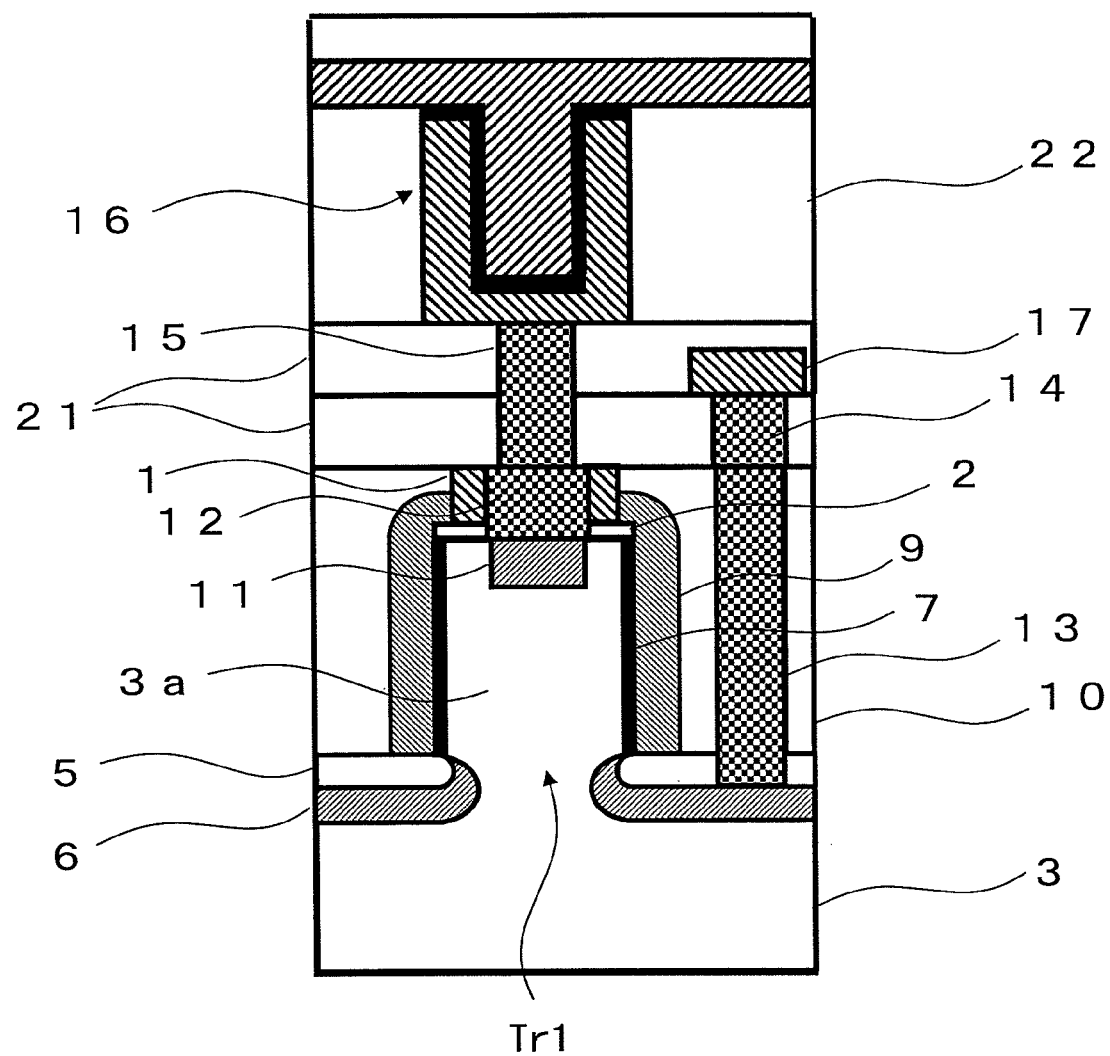
FIG. 19 illustrates a cross-sectional view of a semiconductor device according to a second exemplary embodiment.

This exemplary embodiment is directed to a semiconductor device including DRAM device as a memory cell. As shown in FIG. 19, the memory cell roughly includes transistor Tr1 and capacitor 16 connected to first impurity diffusion region 11 of transistor Tr1 with contact plugs 12, 15 interposed between transistor Tr1 and capacitor 16.

Contact plug 13 is connected to second impurity diffusion region 6 of transistor Tr1. Contact plug 13 is connected to bit line 17 via contact plug 14. Further, although DRAM device includes a plurality of memory cells, FIG. 19 schematically shows a single memory cell.

Interlayer insulating film 22 is formed on interlayer insulating film 21. Capacitor 16 is formed so as to penetrate into interlayer insulating film 22 and be connected to contact plug 15.

Capacitor 16 is formed by forming a lower electrode, a dielectric film and an upper electrode sequentially. That is to say, the lower and upper electrodes are formed using a nitride titanium film and, then, the dielectric film is formed between both electrodes.

A predetermined voltage is applied to the upper electrode of capacitor 16 and, then, whether electrical charges are kept in the capacitor or not is determined, and, hence, storage function of information is carried out in DRAM device.

In case that the vertical transistor according to the present exemplary embodiment is employed in DRAM device, a region which the transistor occupies is smaller, resulting in minimization of DRAM device. Further, in that GIDL is prevented from occurring in the transistor according to the first exemplary embodiment, DRAM device with high performance is attainable.

[Third Exemplary Embodiment]

Figure 20:
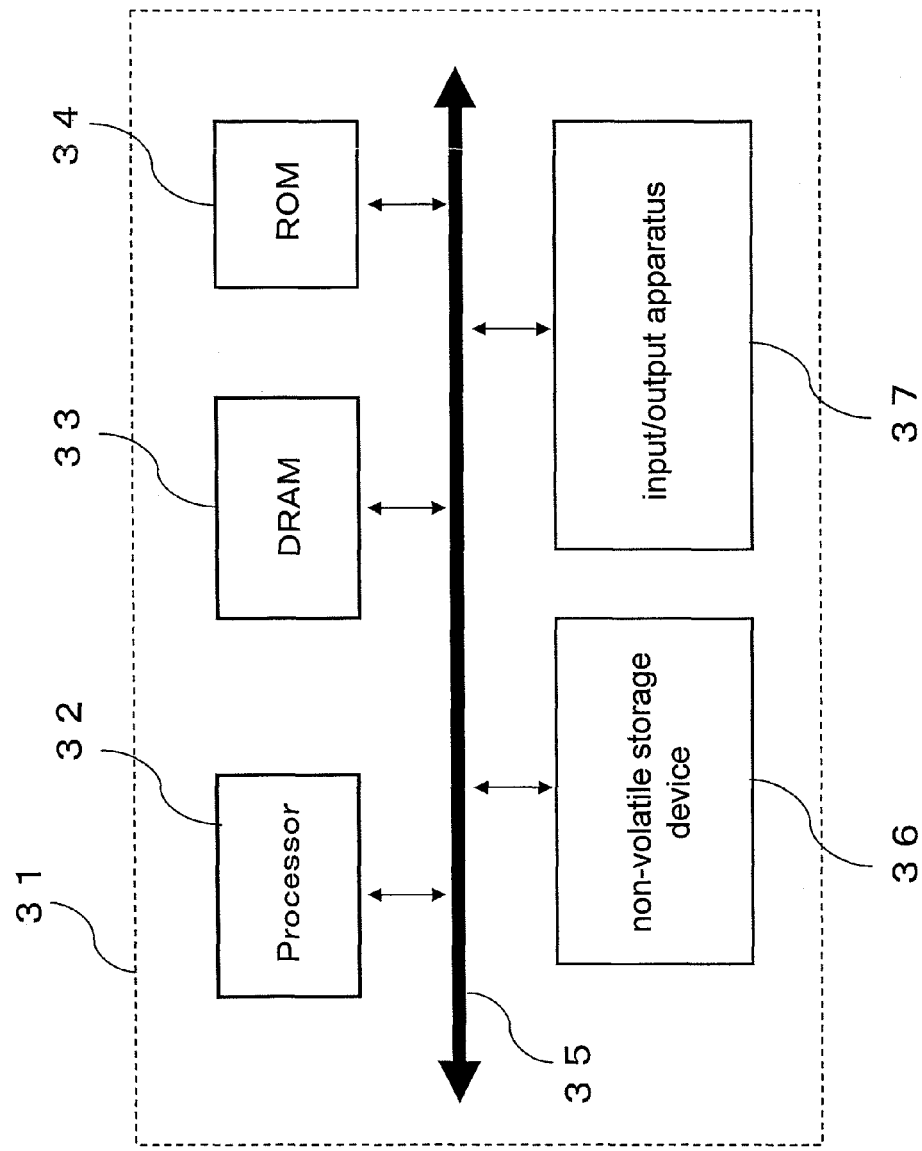
FIG. 20 illustrates a semiconductor device according to a third exemplary embodiment.

FIG. 20 shows a schematic configuration of a data processing system according to a third exemplary embodiment. The data processing system comprises operation processing device 32 and DRAM device 33 which are interconnected via system bus 35.

Operation processing device 32 may include, but is not limited to, MPU (Micro Processing Unit), DSP (Digital Signal Processor) or the like. DRAM device 33 contains the memory cell according to the second exemplary embodiment.

Moreover, ROM (Read Only Memory) 34 for storing fixed data may be connected to system bus 35. Although only one system bus 35 is shown in FIG. 20 for clarity of configuration, a plurality of the system buses, if necessary, may be connected in a parallel or serial way through a connector. The devices may be interconnected by a local bus without being connected to system bus 35.

In the data processing system, non-volatile storage device 36 or input/output apparatus 37, if necessary, may be connected to system bus 35. Non-volatile storage device 36 may include, but is not limited to, a hard disk, an optical drive, SSD (Solid State Drive) or the like.

Input/output apparatus 37 may include, but is not limited to, a display apparatus such as a liquid crystal display, a data input apparatus such as a keyboard, or the like. Although the data processing system is shown in FIG. 20 so that each component thereof is only single for clarity, the present invention is not limited to such a configuration, but, rather, all of the components may be plural or any one of the components may be plural. The data processing system may include, but is not limited to, a computer system.

It is apparent that the present invention is not limited to the above embodiments, but may be modified and changed without departing from the scope and spirit of the invention.

What is claimed is:

1. A semiconductor device, comprising a transistor, wherein the transistor comprises:
   a semiconductor region;
   a pillar region formed on the semiconductor region;
   a gate electrode formed over a side surface of the pillar region with a gate insulating film interposed between the gate electrode and the side surface of the pillar region; and
   a first impurity diffusion region including a side surface and a bottom surface, and
   wherein the first impurity diffusion region is formed in an upper portion of the pillar region so that both the side surface and the bottom surface of the first impurity diffusion region are spaced from the side surface of the pillar region.

2. The semiconductor device according to claim 1, wherein the transistor is a full depletion type transistor.

3. The semiconductor device according to claim 2, wherein a length of the pillar region in a direction perpendicular to the side surface of the pillar region is equal to or less than two times of a height of the pillar region.

4. The semiconductor device according to claim 1, wherein the gate electrode extends from region over the side surface of the pillar region to region on a top surface of the pillar region, and
the gate electrode is disposed such that a portion of the gate electrode on the top surface of the pillar region does not overlap with the first impurity diffusion region.

5. The semiconductor device according to claim 4, further comprising:
   a contact plug formed on the first impurity diffusion region; and
   a sidewall insulating film formed on the top surface of the pillar region and between the gate electrode and the contact plug.

6. The semiconductor device according to claim 5,
wherein a thickness of the sidewall insulating film in a direction perpendicular to the side surface of the pillar region is 20 nm or less.

7. The semiconductor device according to claim 1, further comprising:
   a capacitor connected to the first impurity diffusion region; and
   a bit line connected to a second impurity diffusion region formed in the semiconductor region,
   wherein the transistor and capacitor constitute a memory cell of DRAM (Dynamic Random Access Memory).

8. A semiconductor device, comprising a transistor,
wherein the transistor comprises:
   a semiconductor substrate comprising a semiconductor region and a pillar region formed on the semiconductor region;
   a gate insulating film formed so as to cover a side surface of the pillar region;
   a gate electrode formed on the gate insulating film;
   a first impurity diffusion region formed in an upper portion of the pillar region and including a side surface and a bottom surface; and
   a second impurity diffusion region formed in the semiconductor region so as to surround the pillar region, and
wherein both the side surface and the bottom surface of the first impurity diffusion region are spaced from the side surface of the pillar region.

9. The semiconductor device according to claim 8,
wherein the transistor is a full depletion type transistor.

10. The semiconductor device according to claim 9,
wherein a length of the pillar region in a direction perpendicular to the side surface of the pillar region is equal to or less than two times of a height of the pillar region.

11. The semiconductor device according to claim 8,
wherein the gate electrode extends from region over the side surface of the pillar region to region on a top surface of the pillar region, and
the gate electrode is disposed such that a portion of the gate electrode on the top surface of the pillar region does not overlap with the first impurity diffusion region.

12. The semiconductor device according to claim 11, further comprising:
   a contact plug formed on the first impurity diffusion region; and
   a sidewall insulating film formed on the top surface of the pillar region and between the gate electrode and the contact plug.

13. The semiconductor device according to claim 12,
wherein a thickness of the sidewall insulating film in a direction perpendicular to the side surface of the pillar region is 20 nm or less.

14. The semiconductor device according to claim 8, further comprising:
   a capacitor connected to the first impurity diffusion region; and
   a bit line connected to the second impurity diffusion region formed in the semiconductor region,
   wherein the transistor and capacitor constitute a memory cell of DRAM (Dynamic Random Access Memory).

* * * * *